US012772788B2

(12) United States Patent
Kim et al.

(10) Patent No.: US 12,772,788 B2
(45) Date of Patent: Oct. 20, 2026

(54) ARTICLE TRANSFER APPARATUS AND ARTICLE TRANSFER METHOD

(71) Applicant: SEMES CO., LTD., Cheonan-si (KR)

(72) Inventors: Do-Hyun Kim, Hwaseong-si (KR); Jung Gil Choi, Hwaseong-si (KR); Sung Ho Lee, Anyang-si (KR)

(73) Assignee: Semes Co., LTD., Chungcheongnam-do (KR)

(*) Notice: Subject to any disclaimer, the term of this patent is extended or adjusted under 35 U.S.C. 154(b) by 358 days.

(21) Appl. No.: 18/529,723

(22) Filed: Dec. 5, 2023

(65) Prior Publication Data

US 2024/0199340 A1 Jun. 20, 2024

(30) Foreign Application Priority Data

Dec. 16, 2022 (KR) ........................ 10-2022-0176461
Mar. 29, 2023 (KR) ........................ 10-2023-0041048

(51) Int. Cl.
*H10P 72/30* (2026.01)
*B65G 1/04* (2006.01)

(52) U.S. Cl.
CPC ........ *H10P 72/3218* (2026.01); *B65G 1/0457* (2013.01)

(58) Field of Classification Search
CPC ............. H10P 72/4303; H10P 72/3218; H10P 72/3221; H10P 72/0606; B65G 1/0457;
(Continued)

(56) References Cited

U.S. PATENT DOCUMENTS 1,725,216 A * 8/1929 Seldomridge ......... B66F 7/0691 187/209
2,206,788 A * 7/1940 Meacham ............. B66F 7/0625 254/9 C (Continued)

FOREIGN PATENT DOCUMENTS

CN 101134528 A * 3/2008 ............... B65G 1/10
CN 117246698 A * 12/2023 .......... H10P 72/3404

(Continued)

OTHER PUBLICATIONS

Korean Office Action dated Apr. 30, 2026 issued for corresponding KR patent application No. 10-2023-0041048.

*Primary Examiner* — Kaitlin S Joerger
(74) *Attorney, Agent, or Firm* — HARNESS, DICKEY & PIERCE, P.L.C.

(57) ABSTRACT

Embodiments of the inventive concept provide an article transfer apparatus and an article transfer method which can temporarily load a container, and which can vary its size according to necessity, so an interference with surrounding structures do not occur while varying the size. The inventive concept provides an article transfer apparatus at which an OHT transfers a container. The article transfer apparatus includes: a top support unit fixed to a top space within a semiconductor fab; a bottom support unit positioned spaced apart below the top support unit and on which the container is mounted; a link unit coupled between the top support unit and the bottom support unit and which can be folded; a folding driving unit connecting the top support unit and the link unit, and configured so when not driven a space that the container can be mounted on is formed by the link unit being spread, and when driven the bottom support unit closely contacts the top support unit by folding the link unit, and
(Continued)

wherein the folding driving unit is positioned to not go beyond a top portion of the support unit.

15 Claims, 5 Drawing Sheets

(58) Field of Classification Search
CPC . A47B 46/005; A47B 51/00; A47B 2051/005; B66F 7/0616; B66F 7/0641; B66F 7/0691
See application file for complete search history.

(56) References Cited

U.S. PATENT DOCUMENTS

| | | | | | |
|---|---|---|---|---|---|
| 2,471,901 | A * | 5/1949 | Ross | B66F 7/22 | 182/69.5 |
| 2002/0060137 | A1 * | 5/2002 | Byeong-Ho | B66F 7/0691 | 198/750.1 |
| 2008/0056864 | A1 | 3/2008 | Wada et al. | | |
| 2021/0253362 | A1 | 8/2021 | Oh et al. | | |
| 2023/0197494 | A1 * | 6/2023 | Lee | H10P 72/3204 | 414/217 |
| 2024/0321615 | A1 * | 9/2024 | Jung | H10P 72/3221 | |

FOREIGN PATENT DOCUMENTS

| | | | | | |
|---|---|---|---|---|---|
| JP | 04166555 | A | | 6/1992 | |
| JP | 2018-053647 | A | | 4/2018 | |
| KR | 10-2008-0020965 | A | | 3/2008 | |
| KR | 101600243 | B1 | | 3/2016 | |
| KR | 20190141407 | A | * | 12/2019 | H01L 21/67733 |
| KR | 10-2020-0019695 | A | | 2/2020 | |
| KR | 10-2022-0026360 | A | | 3/2022 | |
| KR | 20220026360 | A | * | 3/2022 | H10P 72/3222 |
| KR | 10-2023-0000592 | A | | 1/2023 | |
| KR | 20230073553 | A | * | 5/2023 | H10P 72/3218 |
| KR | 20230147877 | A | * | 10/2023 | H10P 72/3221 |

* cited by examiner

ARTICLE TRANSFER APPARATUS AND ARTICLE TRANSFER METHOD

CROSS-REFERENCE TO RELATED APPLICATIONS

A claim for priority under 35 U.S.C. § 119 is made to Korean Patent Application No. 10-2022-0176461 filed on Dec. 16, 2022 and Korean Patent Application No. 10-2023-0041048 filed on Mar. 29, 2023, in the Korean Intellectual Property Office, the entire contents of which are hereby incorporated by reference.

BACKGROUND

Embodiments of the inventive concept described herein relate to an article transfer apparatus and an article transfer method, more specifically, an article transfer apparatus and an article method for transferring a substrate.

As technology-intensive future technologies converge, semiconductor manufacturing technology is responding to rapidly changing technology innovation speeds and rapidly changing environments. In particular, as semiconductor elements become more integrated and high-performance products are developed, even article technologies in semiconductor manufacturing processes are pursuing more efficient technologies.

This semiconductor manufacturing article flow is managed according to field conditions through solving a bottleneck phenomenon, improving facility failures, and preventive maintenance (PM).

In accordance with the semiconductor manufacturing article flow, the semiconductor fab (FAB) performs various article transfer using an OHT (Overhead Hoist Transport), in which case the OHT is operated in large quantities on rails, and there is an OCS (OHT Control System) that controls and manages all OHTs.

Meanwhile, the OHT as described above transfers a container on which a substrate is mounted for each semiconductor facility that performs each process. In this case, the OHT temporarily loads the container into a side track buffer (STB) if the container cannot be mounted because the semiconductor facility is in operation.

Such a conventional side track buffer requires a dismantling work due to a lot of interference with semiconductor facilities when semiconductor facilities are installed or replaced. For this reason, in the workspace at which semiconductor facilities are installed or replaced, a OHT container transfer or semiconductor process cannot be operated, resulting in losses.

Accordingly, technical solutions can be considered for the conventional side track buffer such as reducing a size, easily moving, or easily detaching as necessary.

In addition, if the conventional side track buffer is mechanically driven as needed, interference with other parts can be reduced only by considering that a driving point is not outwardly exposed.

In addition, since the conventional side track buffer is mainly installed at a top of the semiconductor manufacturing facility, it may be difficult to extinguish a fire because a water stream sprayed from a spring cooler is blocked in the event of a fire. Therefore, the conventional side track buffer should be designed not to interfere with the water stream sprayed from the spring cooler in the event of a fire.

SUMMARY

Embodiments of the inventive concept provide an article transfer apparatus and an article transfer method which can temporarily load a container, and which can vary its size according to necessity, so an interference with surrounding structures do not occur while varying the size.

Embodiments of the inventive concept provide an article transfer apparatus and an article transfer method which does not let a driving point be exposed to an outside, if a region which temporarily loads a container is drivable.

Embodiments of the inventive concept provide an article transfer apparatus and an article transfer method which does not let a region temporarily loading a container interfere with a water stream path being sprayed from a sprinkler if a fire occurs.

The technical objectives of the inventive concept are not limited to the above-mentioned ones, and the other unmentioned technical objects will become apparent to those skilled in the art from the following description.

The inventive concept provides a article transfer apparatus at which an OHT transfers a container. The article transfer apparatus includes a top support unit fixed to a top space within a semiconductor fab; a bottom support unit positioned spaced apart below the top support unit and on which the container is mounted; a link unit coupled between the top support unit and the bottom support unit and which can be folded; a folding driving unit connecting the top support unit and the link unit, and configured so when not driven a space that the container can be mounted on is formed by the link unit being spread, and when driven the bottom support unit closely contacts the top support unit by folding the link unit, and wherein the folding driving unit is positioned to not go beyond a top portion of the support unit.

In an embodiment, the top support unit has an open region, and the folding driving unit is positioned at the open region of the top support unit.

In an embodiment, the link unit is configured in a plurality and positioned spaced apart from each other, and each of the plurality of link units include: a first support bar having an end rotatably coupled to the top support unit; and a second support bar having an end coupled to the other end of the first support bar and having the other end rotatably coupled to the bottom support unit.

In an embodiment, the link unit includes: a first link unit connected to the top support unit and the bottom support unit; a second link unit connected to the top support unit and the bottom support unit, positioned spaced apart from the first link unit, and folding in a direction facing the first link unit; a third link unit connected to the top support unit and the bottom support unit, positioned spaced apart from the first link unit, and folding in a same direction as the first link unit; and a fourth link unit connected to the top support unit and the bottom support unit, positioned facing the third link unit, and folding in a same direction as the second link unit.

In an embodiment, the link unit includes: a first link shaft connecting points at which the first link unit and the third link unit pin couple to; and a second link shaft connecting points at which the second link unit and the fourth link unit pin couple to.

In an embodiment, the link unit includes: a first folding shaft connected between the first link unit and the third link unit, and which couples to the folding driving unit; and a second folding shaft connected between the second link unit and the fourth link unit, and which couples to the folding driving unit.

In an embodiment, the folding driving unit includes: a first rod having an end coupled to a folding shaft of the link unit; and a driving actuator having an end coupled to the other end of the first rod and a body coupled to the top support unit, and when forwardly driven forwardly drives the first rod and when backwardly driven backwardly drives the first rod.

In an embodiment, the article transfer apparatus further includes a fixing member for coupling between the top support unit and the semiconductor fab.

In an embodiment, the article transfer apparatus further includes a buffer identification sensor coupled to the top support unit and which transmits a buffer information to the OHT by communicating with the OHT.

In an embodiment, the buffer identification sensor is formed as an RFID tag, the RFID tag includes the buffer information, and the OHT reads the buffer information if it adjoins a region at which communication with the RFID tag is possible.

In an embodiment, the article transfer apparatus further includes: a control system which controls the OHT to transfer the OHT positioned in a loaded state according to a transfer scheduling of the container, or to load the container to a region which is not loaded.

In an embodiment, the article transfer apparatus further includes: a load detection sensor installed at the bottom support unit and which generates a load signal when mounted on the container.

In an embodiment, the control system is input with the load signal in communication with the load identification sensor, the load identification sensor generates a load/unload information for each region at which the load identification sensor is installed, sets the load/unload information as a load state with respect to a region at which the load sensor is generated, and which sets the load/unload information as an unload state with respect to a region at which the load signal is not generated.

In an embodiment, the bottom support unit provides a mounting region at which a plurality of containers are mounted, and the load identification sensor is installed at each of a plurality of mounting regions, and the control system activates the folding driving unit to a driving possible state if the load signal is not generated at an entirety of the load identification sensors, and deactivates the folding driving unit so it does not drive if at least one among the load identification sensor generates the load signal.

In an embodiment, the article transfer apparatus further includes: a buffer control unit configured to be input with a container information of the container by communicating with the container when the container is mounted on the mounting region, and which transmits the container information which is input to the control system.

In an embodiment, the buffer control unit includes: an antenna unit installed at the bottom support unit; and a buffer communication unit electrically connected to the antenna unit and which communicates with the control system, and transmits the container information to the control system when the container is loaded.

In an embodiment, the article transfer apparatus further includes: a reflective plate which couples with the bottom support unit and which reflects a light; and wherein the OHT determines a mounting region of the container by sensing the reflective plate.

In an embodiment, the folding driving unit further includes a manual operation unit, and wherein the manual operation unit couples to a side of the top support unit, connects to a driving shaft of the folding driving unit, and by rotating in a direction the folding driving unit is driven to fold the link unit, and by rotating in another direction the folding driving unit is driven to open the link unit.

The inventive concept provides an article transfer method. The article transfer method includes transferring a container to a semiconductor manufacturing facility by an OHT by transferring the OHT by a control system according to a transfer scheduling; determining a driving state of the semiconductor manufacturing facility by the control system; searching for a mounting region at which a load signal is not generated by communicating with a load detection sensor by the control system when the semiconductor manufacturing facility is operated; determining whether a mounting region in which a drive state information is in a non-driven state, after checking the drive state information of the folding driving unit by communicating with the folding driving unit positioned in the mounting region at which the load signal has not been generated by the control system; transferring a position information at which the load signal has not occurred to the OHT by the control system; moving the OHT to a position of the position information; adjusting the mounting position by sensing the mounting region after the OHT is moved to the position information; loading the container to the mounting region by the OHT; and setting a folding state by activating the folding driving unit to a drivable state if a loading signal does not occur at an entirety of the mounting regions among the mounting regions, and deactivating the folding driving unit so it cannot drive if at least one load signal occurs.

The inventive concept provides an article transfer apparatus at which an OHT transfers a container. The article transfer apparatus includes a top support unit fixed to a top space within a semiconductor fab and at which an open region is formed; a bottom support unit positioned spaced apart below the top support unit and including a plurality of mounting regions on which the container is mounted; a fixing member coupled between the top support unit and the semiconductor fab; a link unit coupled between the top support unit and the bottom support unit, which can be folded, and which is configured in a plurality to be spaced apart from each other; a folding driving unit positioned at the open region, connecting the top support unit and the link unit, configured so when not driven a space that the container can be mounted on is formed by the link unit being spread, and when driven the bottom support unit closely contacts the top support unit by folding the link unit, and the folding driving unit is positioned to not go beyond a top portion of the support unit; a buffer identification sensor formed as an RFID tag and including a buffer information, coupled to the top support unit, and which transmits the buffer information to the OHT by communicating with the OHT; a load detection sensor installed at each mounting region of the bottom support unit, and which generates a load signal when mounted on the container; a control system which controls the OHT to transfer the OHT positioned in a loaded state according to a transfer scheduling of the container, or to load the container to a region which is not loaded, and the control system is input with the load signal in communication with the load identification sensor, the load identification sensor generates a load/unload information for each region at which the load identification sensor is installed, sets the load/unload information as a load state with respect to a region at which the load sensor is generated, and which sets the load/unload information as an unload state with respect to a region at which the load signal is not generated, and activates the folding driving unit to a drivable state if the loading signal does not occur at an entirety of the load detection sensors, and deactivates the folding driving unit so it cannot drive if at least one load signal occurs among the load detection sensors; a buffer control unit including an antenna unit installed at the bottom support unit and a buffer communication unit electrically connected to the antenna unit and which communicates with the control system, and transmits the container information to the control system when the container is loaded, and which is configured to be input with a container information of the container by communicating with the container when the container is mounted on the mounting region, and which transmits the container information which is input to the control system; and a reflective plate which couples with the bottom support unit and which reflects a light, and wherein the link unit includes: a first link unit connected to the top support unit and the bottom support unit; a second link unit connected to the top support unit and the bottom support unit, positioned spaced apart from the first link unit, and folding in a direction facing the first link unit; a third link unit connected to the top support unit and the bottom support unit, positioned spaced apart from the first link unit, and folding in a same direction as the first link unit; and a fourth link unit connected to the top support unit and the bottom support unit, positioned facing the third link unit, and folding in a same direction as the second link unit; a first link shaft connecting points at which the first link unit and the third link unit pin couple to; a second link shaft connecting points at which the second link unit and the fourth link unit pin couple to; a first folding shaft connected between the first link unit and the third link unit, and which couples to the folding driving unit; a second folding shaft connected between the second link unit and the fourth link unit, and which couples to the folding driving unit, and wherein each of the plurality of link units include: a first support bar having an end rotatably coupled to the top support unit; and a second support bar having an end coupled to the other end of the first support bar and having the other end rotatably coupled to the bottom support unit, and wherein the folding driving unit includes: a first rod having an end coupled to a folding shaft of the link unit; a driving actuator having an end coupled to the other end of the first rod and a body coupled to the top support unit, and when forwardly driven forwardly drives the first rod and when backwardly driven backwardly drives the first rod; and a manual operation unit which couples to a side of the top support unit, connects to a driving shaft of the folding driving unit, and by rotating in a direction the folding driving unit is driven to fold the link unit, and by rotating in another direction the folding driving unit is driven to open the link unit.

According to an embodiment of the inventive concept, a container may be temporarily loaded, its size may be varied according to necessity, and an interference with surrounding structures do not occur while varying the size.

According to an embodiment of the inventive concept, a driving point is not exposed to an outside if a region which temporarily loads a container is mechanically drivable.

According to an embodiment of the inventive concept, a region temporarily loading a container does not interfere with a water stream path being sprayed from a sprinkler if a fire occurs.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
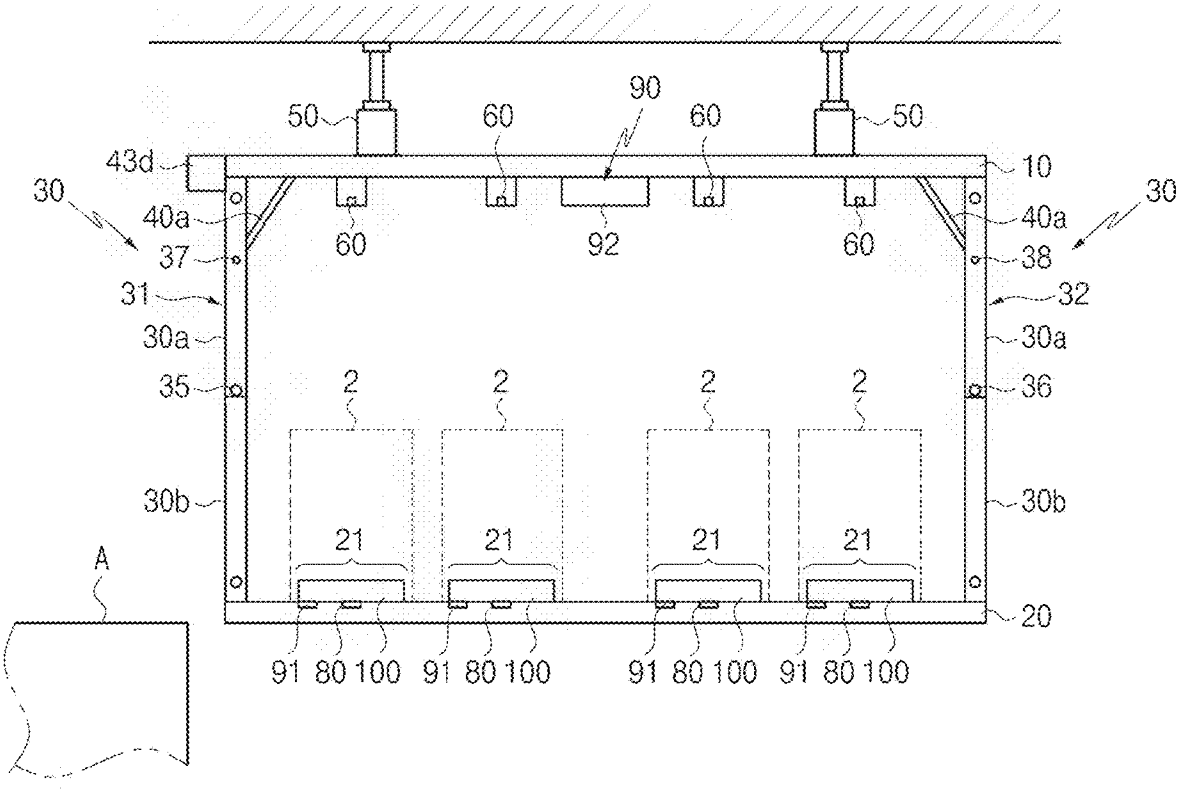
FIG. 1 is a front view of an article transfer apparatus according to an embodiment of the inventive concept.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
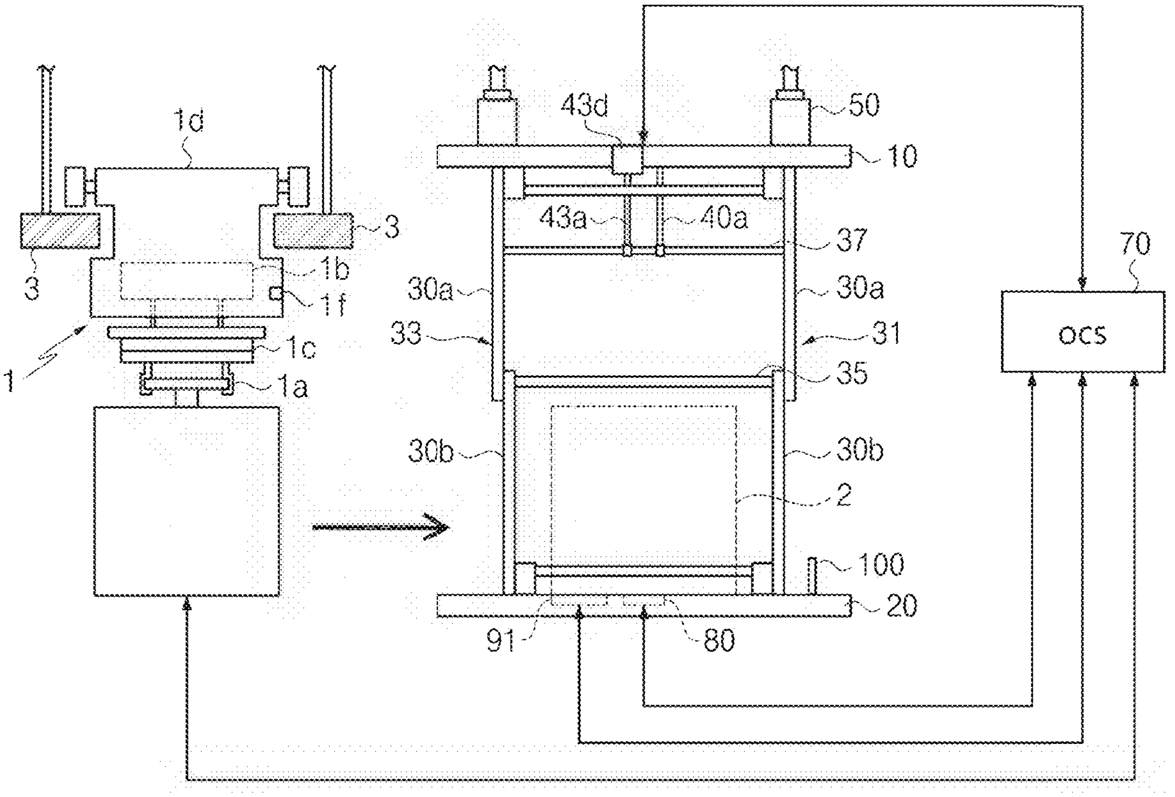
FIG. 2 is a left side view of the article transfer apparatus illustrated in FIG. 1.
Figure 3:
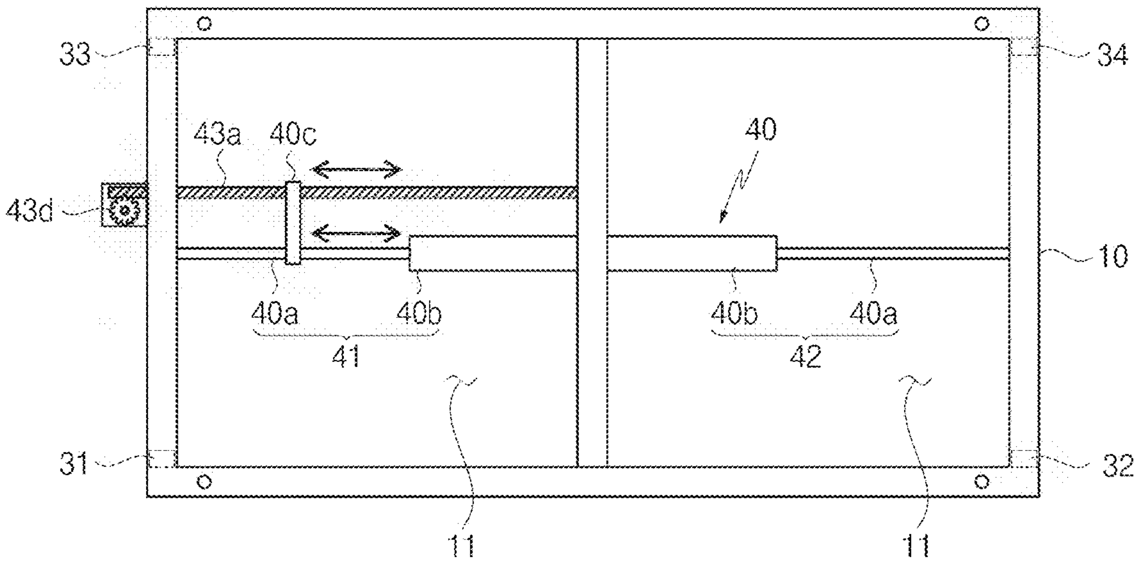
FIG. 3 is a plan view of the article transfer apparatus illustrated in FIG. 1.
Figure 4:
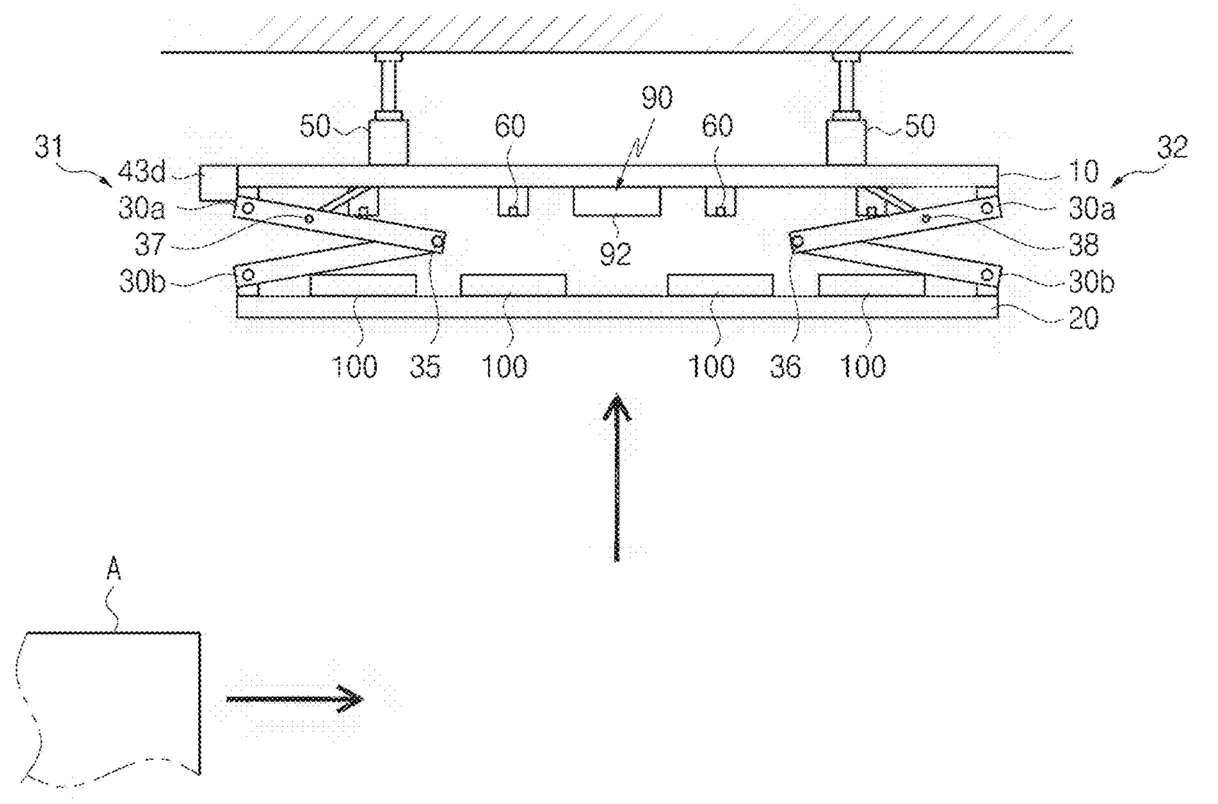
FIG. 4 is a front view illustrating a state in which the article transfer apparatus illustrated in FIG. 1 is folded.

FIG. 1 is a front view of an article transfer apparatus according to an embodiment of the inventive concept. FIG. 2 is a left side view of the article transfer apparatus illustrated in FIG. 1. FIG. 3 is a plan view of the article transfer apparatus illustrated in FIG. 1. FIG. 4 is a front view illustrating a state in which the article transfer apparatus illustrated in FIG. 1 is folded.

As described in FIG. 1 to FIG. 4, an article transfer apparatus according to an embodiment of the inventive concept may include a top support unit 10, a bottom support unit 20, a link unit 30, a folding driving unit 40, a fixing member 50, a buffer identification sensor 60, a control system 70, a load detection sensor 80, a buffer control unit 90, and a reflective plate 100.

Before explaining a detailed configuration of the article transfer apparatus according to an embodiment of the inventive concept, the article transfer apparatus according to an embodiment of the inventive concept is provided on a ceiling to be adjacent to a driving rail 3 (not shown) on which an OHT 1 drives on and is used to temporarily load the container 2 which the OHT 1 transfers. Here, as an embodiment of the container 2, the container 2 may be formed of a FOUP. In addition, the OHT 1 illustrated in the embodiment is an apparatus which transfers the container 2 by autonomously driving along the rail 3. In this case, the OHT 1 may transfer the container 2 according to a transfer scheduling in connection with a control system 70 and transfer the container 2. Meanwhile, the OHT 1 illustrated in the embodiment further includes a lidar sensor 1*f* for detecting objects when autonomously driving along the rail 3, and can extract a shape information of an object from the lidar sensor 1*f*. Furthermore, the OHT 1 may further include a transfer hand unit which binds to the container 2 when transferring the container 2, and in this case, the transfer hand unit may further include a hand unit 1*a* which lifts the container 2 by combining with the container 2, a belt driving unit 1*b* which can transfer the hand unit 1*a* by connecting via belt to move in a vertical direction, and a transfer body 1*c* to slide the hand unit 1*a* in a lateral direction, and a wheel driving unit 1*d* to drive a wheel by mounting on a top surface of the rail 3. However, in the inventive concept, the configuration of the OHT 1 is not limited to the above example, and the OHT 1 can be loaded/unloaded and transferred by upwardly/downwardly moving and laterally moving the container 2 while binding the container 2, and can be modified into all types of autonomous transport apparatuses which autonomously drive on the rail 3 according to transfer scheduling.

The top support unit 10 is fixed to a top space within a semiconductor fab. The top support unit 10 provides a region to which the link unit 30 and the folding driving unit 40 are coupled. In this case, the top support unit 10 is connected to a ceiling surface of the semiconductor fab by the fixing member 50 or is coupled around the rail 3 in which the OHT 1 moves. In addition, the top support unit 10 is formed in a frame shape of a square frame. In this case, the top support unit 10 has an open region 11 formed within. A folding driving unit 40 is disposed in the open region 11. This open region 11 provides a region at which the folding driving unit 40 will be placed, so that the folding driving unit 40 does not exceed a top part of the top support unit 10. As such, since the folding driving unit 40 is accommodated in the open region 11, points driven when the folding driving unit 40 drives is not exposed to an outside of the top support unit 10. Accordingly, the folding driving unit 40 does not interfere with outer components during driving. For example, interference with outer components such as an electrical wiring (not shown) or other piping facilities (not shown) does not occur in the top region of the top support unit 10. In addition, the open region 11 is formed not only in the folding driving unit 40 but also in the bottom support unit 20. Therefore, in the event of a fire, a water stream sprayed from a spring cooler (not shown) passes through the open regions 11 and is sprayed toward the semiconductor manufacturing facility A.

The bottom support unit 20 is spaced apart from a bottom part of the top support unit 10, and provides a mounting region 21 in which the container 2 is mounted. In this case, a plurality of mounting regions 21 may be configured to seat a plurality of containers 2. In such a bottom support unit 20, a number of bars are formed in a grid-shaped frame shape, so that the container 2 can be mounted in the mounting region 21. In addition, the open region 11 can be formed in the bottom support unit 20 so that the water stream sprayed from the sprinkler passes through in the event of a fire.

The link unit 30 is coupled to the top support unit 10 and the bottom support unit 20. In this case, the link unit 30 is rotatably pin-coupled to a point coupled to each of the top support unit 10 and the bottom support unit 20. In addition, the link unit 30 is formed in an unfolded state when the folding driving unit 40 is not driven, and then folded when the folding driving unit is driven. In addition, the link unit 30 is composed of a plurality and is disposed to be spaced apart from each other. For example, as is illustrated, the link unit 30 includes a first link unit 31 connected to the top support unit 10 and the bottom support unit 20, a second link unit 32 connected to the top support unit 10 and the bottom support unit 20, and spaced apart from the first link unit 31 and folding in a direction facing the first link unit 31, a third link unit 33 connected to the top support unit 10 and the bottom support unit 20, and spaced apart from the first link unit 31 and folding in a direction which is the same as the first link unit 31, and a fourth link unit 34 connected to the top support unit 10 and the bottom support unit 20, placed in a direction facing the third link unit 33, and folding in the same direction as the second link unit 32. In this way, the link unit 30 can be connected near the four corners between the top support unit 10 and the bottom support unit 20 in a region between the top support unit 10 and the bottom support unit 20.

In addition, each of the first link unit 31, the second link unit 32, the third link unit 33, and the fourth link unit 34 may include a first support bar 30*a* that is rotatably coupled to the top support unit 10, and a second support bar 30*b* that is rotatably coupled to the other end of the first support bar 30*a* and which the other end is rotatably coupled to the bottom support unit. In addition, the first link unit 31, the second link unit 32, the third link unit 33, and the fourth link unit 34 may be configured by linking three or more support bars (not shown) as necessary.

In addition, the link unit 30 may further include a first link shaft 35 and a second link shaft 36.

The first link shaft 35 connects points at which the first link unit 31 and the third link unit 33 are pin-coupled. In this case, the first link shaft 35 may be formed in a rod or bar shape. The first link shaft 35 connects a point at which the first link unit 31 and the third link unit 33 are pin-coupled. Therefore, when the first link unit 31 and the third link unit 33 are folded, they rotate at the same angle with respect to the first link shaft 35. If the first link shaft 35 is not formed between the first link unit 31 and the third link unit 33, when the first link unit 31 and the third link unit 33 are folded, the first link unit 31 and the third link unit 33 may be folded at different angles. Accordingly, the top support unit 10 and the bottom support unit 20 may not maintain a parallel state with each other and may be folded in a twisted state. In this way, the first link shaft serves to prevent a twisting when the first link unit 31 and the third link unit 33 are folded.

The second link shaft 36 connects points at which the second link unit 32 and the fourth link unit 34 are pin-coupled. In this case, the second link shaft 36 may be formed in a rod or bar shape. The second link shaft 36 connects a point at which the second link unit 32 and the fourth link unit 34 are pin-coupled. Therefore, when the second link unit 32 and the fourth link unit 34 are folded, the second link unit 32 and the fourth link unit 34 rotate at the same angle with respect to the second link shaft 36. If the second link shaft 36 is not formed between the second link unit 32 and the fourth link unit 34, the second link unit 32 and the fourth link 34 unit may be folded at different angles when the second link unit 32 and the fourth link 34 unit are folded. Accordingly, the top support unit 10 and the bottom support unit 20 may not be folded parallel to each other, but may be folded in a twisted state. In this way, the second link shaft 36 serves to prevent twisting when the second link unit 32 and the fourth link unit 34 are folded. As such, the second link shaft 36 has a different connection structure from the first link shaft 35 and implements a function similar to that of the first link shaft 35.

In addition, the link unit 30 may further include a first folding shaft 37 and a second folding shaft 38.

The first folding shaft 37 is connected between the first link unit 31 and the third link unit 33. In addition, the first folding shaft 37 is rotatably coupled to an end of the first folding driving unit 41. The first folding shaft 37 rotates the first link unit 31 and the third link unit 33 at the same time when the first folding driving unit 41 is driven. Since the first link unit 31 and the third link unit 33 rotate simultaneously by the first folding shaft 37 when the first folding driving unit 41 is driven, the first link unit 31 and the third link unit 33 are folded at the same angle. Therefore, when the first link unit 31 and the third link unit 33 are folded, the top support unit 10 and the bottom support unit 20 may be folded in an undistorted state.

The second folding shaft 38 is connected between the second link unit 32 and the fourth link unit 34. In addition, the second folding shaft 38 is rotatably coupled to an end of the second folding driving unit 42. The second folding shaft 38 rotates the second link unit 32 and the fourth link unit 34 at the same time when the second folding driving unit 42 is driven. Since the second link unit 32 and the fourth link unit 34 rotate simultaneously by the second folding shaft 38 when the second folding driving unit 42 is driven, the second link unit 32 and the fourth link unit 34 are folded at the same angle. Therefore, the top support unit 10 and the bottom support unit may be folded without distortion when the second link unit 32 and the fourth link unit 34 are folded. The second folding shaft 38 has a connection structure different from that of the first folding shaft 37, and implements a function similar to that of the first folding shaft 37.

The folding driving unit 40 is coupled between the top support unit 10 and the link unit 30. The folding driving unit 40 is formed with the link unit 30 unfolded when not driving, so that the container 2 can be inserted into the bottom support unit 20. In addition, the folding driving unit 40 moves the bottom support unit 20 toward the top support unit 10 by folding the link unit when driving. The folding driving unit 40 may include a first rod 40*a* having an end coupled to the folding shaft of the link unit 30, and a drive actuator 40*b* having an end coupled to the other end of the first rod 40*a*, and the body coupled to the top support unit 10, and advancing the first rod 40*a* when forwardly driving and reverse the first rod 40*a* when backwardly driving. Here, the drive actuator 40*b* is an actuator that can forwardly and backwardly move, and can be modified into an actuator such as a linear motor, a ball screw motor, or a pneumatic cylinder. The first rod 40*a* can be rotatably coupled to the folding shaft while the drive actuator 40*b* is coupled to the top support unit 10. In addition, a plurality of folding driving units 40 may be configured. For example, the folding driving unit 40 can be configured to include a first folding driving unit 41 and a second folding driving unit 42, as illustrated in this embodiment. In this case, the first folding driving unit 41 may have the first rod 40*a* coupled to the first folding shaft 37 while the body is coupled to the top support unit. In addition, in the second folding driving unit 42, the first rod 40*a* may be coupled to the second folding shaft 38 while the body is coupled to the top support unit 10. In this case, the first folding driving unit 41 and the second folding driving unit 42 may be disposed to face each other so that the first rod 40*a* is driven in the opposite direction. In addition, the folding driving unit 40 can be forwardly driven and backwardly driven by the control system 70 in connection with the control system 70.

In addition, the folding driving unit 40 can be controlled manually as well as automatically to forwardly and backwardly move by electronic control methods as described above. Accordingly, the folding driving unit 40 may further include a manual operation unit 43. The manual operation unit 43 is coupled to a side of the top support unit 10 and may be connected to a drive shaft of the folding driving unit 40. In this case, the manual operation unit 43 may be coupled to the first rod 40*a* to be configured to forwardly and backwardly move the first rod 40*a*. For example, the manual operation unit 43 may be configured in a form in which the ball screw transfer body 43*a* is coupled to the top support unit 10 and the link unit 30, and the ball screw transfer body 43*a* is coupled to the first rod 40*a* of the folding driving unit 40 by a fastening member 40*d* of the ball screw transfer body 43*a*. In this case, the ball screw transfer body can forwardly move the first rod 40*a* when rotating in a direction, and backwardly move the first rod 40*a* when rotating in the other direction. In this case, the ball screw transfer body 43*a* may be configured such that a rotation fastening element such as a gear box 43*d* is further configured to easily rotate. Here, the ball screw transfer body 43*a* can forwardly move the first rod 40*a* when the operator rotates the gear of the gear box 43*d* in the forward direction using a rod-shaped tool (not shown), and can backwardly move the first rod 40*a* when rotating the gear of the gear box in the reverse direction. However, in the inventive concept, the configuration of the manual operation unit 43 is not limited to the above example, and the configuration of the manual operation unit 43 can be modified into various forms that can manually forwardly and backwardly move the folding driving unit 40. For example, the manual operation unit 43 may be configured to further couple a gas cylinder (not shown) to the first rod 40*a*. In this case, the gas cylinder may forwardly or backwardly move the first rod 40*a* according to the forward or backward operation direction. As in this example, the manual operation unit 43 may be modified and implemented in various forms, such as a form in which the first rod 40*a* is forwardly and backwardly moved. Since the folding driving unit 40 is further configured with a manual operation unit 43, the operator can arbitrarily forwardly and backwardly move the folding driving unit in the event of a power failure or an emergency. However, in the inventive concept, the driving method of the folding driving unit 40 is not limited to the manual method as described above, and the folding driving unit 40 may selectively configure at least one of the automatic method or the manual method described above.

The fixing member 50 is coupled between the top support unit 10 and the semiconductor fab to fix the top support unit 10. The fixing member 50 may be configured by selectively combining fastening elements such as wires, bars, anchor bolts, rings, and turn buckles.

The buffer identification sensor 60 provides a buffer information to the OHT 1. For example, the buffer identification sensor 60 may be configured as an RFID tag that provides the buffer information through a short-range wireless communication. In this case, the OHT 1 reads the buffer information from the RFID tag when it approaches within a communicable range of the RFID tag. Here, the buffer information is a unique address information for each of the mounting regions 21 when the container 2 lands on the mounting region 21 of the bottom support unit 20. Accordingly, the buffer identification sensor 60 is configured with a number corresponding to each mounting region 21. In this case, the buffer identification sensor 60 may be coupled and disposed to the top support unit 10, and the coupling position may be changed as necessary. For example, the buffer identification sensor 60 may also be coupled to the bottom support unit 20. On the other hand, if the OHT 1 simultaneously reads a plurality of buffer information from a plurality of buffer identification sensors 60 and receives the plurality of buffer information, it selects any one buffer information. Here, the OHT 1 uses the strength of the signal reception strength (RSSI) received from the tag of RFID as a criterion for selecting any one buffer information. In this case, the OHT 1 may select the buffer information on the RFID tag, which forms the largest intensity value among the intensities of signal reception intensity (RSSI) received from the plurality of RFID tags, as being positioned in the closest position.

The control system 70 transfers the OHT 1 positioned in the loaded region according to the transfer scheduling of the container 2, or controls the OHT 1 so that the container 2 is loaded in the unloaded region. In addition, the control system 70 monitors a position information and a status information of the OHTs 1 in connection with the OHTs 1 driving autonomously along the rail 3. For example, the control system 70 can monitor a current position information and power status information of the OHTs 1, and can display the monitoring information on the control system (not shown). Here, the control system 70 may perform a wireless communication with the OHT 1 to monitor the OHT 1.

In addition, the control system 70 receives a loading signal in connection with the load detection sensor 80. At this time, the control system 70 generates a loading status information for each region at which each load detection sensor 80 is installed, and in this case, the control system 70 sets the loading status information for a region at which the loading signal is generated and a non-loading information for a region at which the loading signal is not generated. Therefore, the control system 70 can monitor each of the mounting region 21 by distinguishing whether the container 2 is loaded or not. In this case, the control system 70 changes the transfer scheduling of the container 2 to a preset algorithm according to the loading information. Therefore, when the OHT 1 temporarily loads the container 2 in the mounting region 21, the control system 70 can efficiently schedule a driving of a loading/unloading of the OHT 1 according to the loading state of the container 2.

In addition, the control system 70 may activate the folding driving unit 40 in an operable state if no load signal is generated throughout the load detection sensors 80, and may cut off the power supply of the folding driving unit 40 or block the control drive to be deactivated if a loading signal is generated among any one of the the load detection sensors. Therefore, the folding driving unit 40 prevents an accident in which the link unit 30 is folded while the container 2 is mounted on the bottom support unit 20.

The load detection sensor 80 is installed in the bottom support unit 20 and may generate a loading signal when the container 2 is mounted. The load detection sensor 80 may be coupled to each of the mounting regions 21. For example, the bottom support unit 20 forms a plurality of mounting regions 21, and load detection sensors 80 are installed in each of the plurality of mounting regions 21. The load detection sensor 80 may be configured as a sensor that detects a physical quantity of the container 2 to generate the loading signal when the container 2 is mounted. For example, the load detection sensor 80 can be modified into a tact switch that generates a load signal when pressed by the container 2, a pressure sensor that detects a weight of the container 2 to generate the load signal, a magnetic sensor generating the load signal by detecting a magnetic charge of the container, a photo sensor generating the loading signal according to a change of an intensity of radiation when the container is mounted, and an ultra sonic wave sense generating the loading signal according to a reflection amount of the ultrasonic wave when the container is mounted.

When the container 2 is mounted on the mounting region 21, the buffer control unit 90 receives the container information from the container 2 in connection with the container 2, and transmits a received container information to the control system 70. In addition, the buffer control unit 90 is connected with the load detection sensor 80 and the control system 70. In this case, the buffer control unit 90 may transmit the loading signal generated by the load detection sensor 80 to the control system 70.

As an embodiment of the buffer control unit 90, the buffer control unit 90 includes an antenna unit 91 and a buffer communication unit 92.

The antenna unit 91 is installed on a bottom support unit. In this case, the antenna unit 91 may be a loop type antenna for connecting with the RFID tag. In addition, the antenna unit 91 is electrically connected to the buffer communication unit 92. In this case, the antenna unit 91 may have more electrical wiring (not shown) that electrically connects the bottom support unit 20 and the buffer communication unit 92 to be electrically connected to the buffer communication unit 92.

The buffer communication unit 92 is a process apparatus capable of a wired and wireless communication driven by a pre-stored algorithm. The buffer communication unit 92 is electrically connected to the antenna unit 91 and connected with the control system 70, and transmits the container information to the control system 70 when the container 2 is loaded. In addition, the buffer communication unit 92 can transmit the loading signal generated by the load detection sensor 80 to the control system 70 in connection with the load detection sensor 80.

The reflective plate 100 is coupled to the bottom support unit 20 to reflect a light. In this case, the reflective plate 100 may be formed in a shape in which a curve is formed according to a flat plate shape or a shape of the mounting region 21. Here, the OHT 1 senses the reflective plate 100 through the lidar sensor If to determine the mounting region 21 of the container 2. Therefore, OHT 1 can precisely determine a region in which container 2 can be mounted on the mounting region 21, and then adjust a position to mount the container 2.

Hereinafter, an article transfer method according to an embodiment of the inventive concept as described above will be described.

Figure 5:
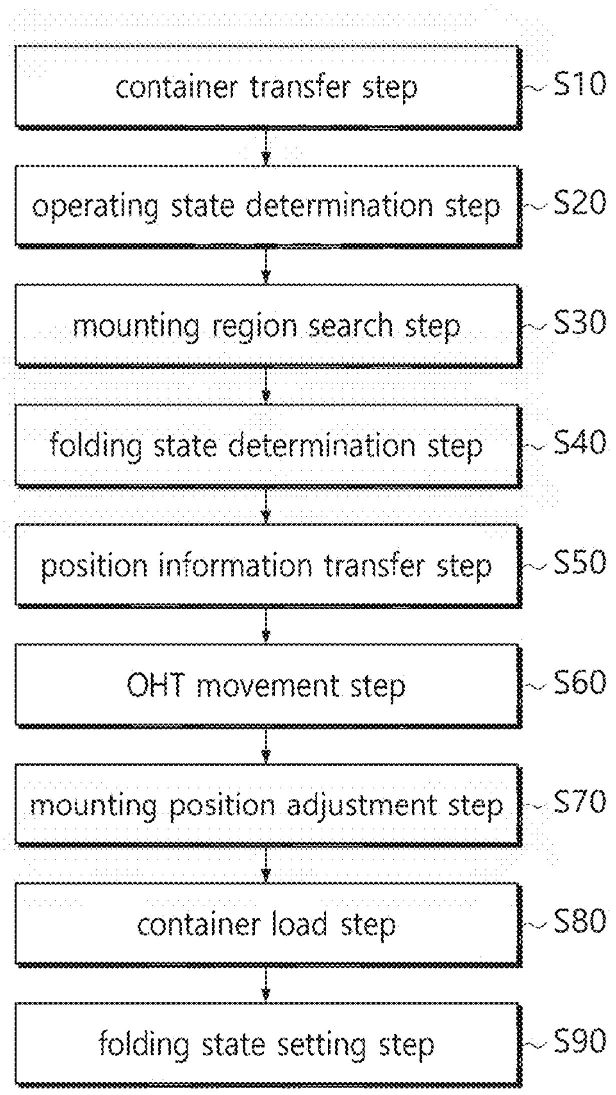
FIG. 5 is a flowchart of an article transfer method according to an embodiment of the inventive concept.

FIG. 5 is a flowchart of an article transfer method according to an embodiment of the inventive concept.

According to FIG. 5, the article transfer method according to an embodiment of the inventive concept may include a container transfer step S10, an operating state determination step S20, a mounting region search step S30, a folding state determination step S40, a position information transfer step S50, an OHT movement step S60, a mounting position adjustment step S70, a container load step S80, and a folding state setting step S90.

First, in the container transfer step S10, the control system 70 autonomously drives the OHT 1 by a transfer scheduling, and the OHT 1 transfers the container 2 to the semiconductor manufacturing facility A.

Next, in the operating state determination step S20, the control system 70 determines an operation state of the semiconductor manufacturing facility A. In this case, the control system 70 may determine the operating state of the semiconductor manufacturing facility A in connection with the process controller (not shown) of the semiconductor manufacturing facility A.

Next, in the mounting region search step S30, when the semiconductor manufacturing facility A is operated, the control system 70 communicates with the loading detection sensor 80 to search the mounting region 21 at which the loading signal is not generated and the mounting region 21 at which the loading signal is generated.

Next, in the folding state determination step S40, the control system 70 checks the driving state information of the folding driving unit 40 in connection with the folding driving unit positioned in the mounting region 21 at which the loading signal is not generated, and determines the mounting region 21.

Next, in the position information transfer step S50, the control system 70 transmits the position information to the OHT 1 at which the loading signal has not been generated.

Next, in the OHT movement step S60, the OHT 1 autonomously drives on the rail 3 and moves to the position of the position information. In this case, the OHT 1 may obtain the position information through a position information tag (not shown) installed on the rail 3.

Next, in the mounting position adjustment step S70, the OHT 1 moves to the position information, and then senses the mounting region 21 to adjust the mounting position. In this case, the OHT 1 can precisely adjust the position at which the container 2 will be mounted through the detected shape information of the reflective plate 100 by detecting the shape information of the reflective plate 100 using the lidar sensor 1*f*.

Next, in the container load step S80, the OHT 1 loads the container 2 into the mounting region 21. In this case, in the container load step S80, the OHT 1 drives the transfer body 1*c* to move the transfer hand unit 2*a* in the lateral direction, so that the container 2 can be loaded in the mounting region 21.

In this way, the article transfer apparatus according to an embodiment of the inventive concept takes out the container 2 toward the semiconductor manufacturing facility A in the order of input of the loaded container 2 after loading the container 2. In this case, when the container 2 is taken out, the control system 70 proceeds with the mounting region search step S30 to select the container 2 input in the semiconductor manufacturing facility A, and moves the OHT 1 to a position of the selected container 2 to take out the container 2.

On the other hand, as described above, in the article transfer method according to an embodiment of the inventive concept, a situation may occur in which a new semiconductor manufacturing facility A is installed after the container 2 is temporarily loaded and unloaded. In this case, the article transfer method according to an embodiment of the inventive concept may further include a folding state setting step S90 so that the folding driving unit 40 is not driven while the container 2 is mounted.

In this folding state setting step S90, if the control system 70 does not generate a loading signal in the entire adjacent mounting region 21 among the mounting regions 21, the folding driving unit 40 is activated in a drivable state. In addition, in the folding state setting step S90, if at least one loading signal is generated, the folding driving unit 40 is deactivated to prevent it from being driven. When the folding driving unit 40 is deactivated, the folding driving unit 40 may be physically locked and not driven. Therefore, in the article transfer method according to an embodiment of the inventive concept, the folding driving unit 40 is not driven while the container 2 is mounted, so that the folding driving unit 40 can prevent an accident in which the container 2 is mounted. Here, if the folding driving unit 40 is in an operable state in the folding state setting step S90, the link unit 30 can be folded by driving the folding driving unit 40 automatically or manually, as described above.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. An article transfer apparatus at which an OHT transfers a container, the article transfer apparatus comprising:

a top support unit fixed to a top space within a semiconductor fab;

a bottom support unit positioned spaced apart below the top support unit and on which the container is mounted;

a link unit coupled between the top support unit and the bottom support unit and which can be folded;

a folding driving unit connecting the top support unit and the link unit, and configured so when not driven a space that the container can be mounted on is formed by the link unit being spread, and when driven the bottom support unit closely contacts the top support unit by folding the link unit;

a control system which controls the OHT to transfer the OHT positioned in a loaded state according to a transfer scheduling of the container, or to load the container to a region which is not loaded;

a load detection sensor installed at the bottom support unit and which generates a load signal when mounted on the container, and wherein the folding driving unit is positioned to not go beyond a top portion of the top support unit, wherein the control system is input with the load signal in communication with the load detection sensor, the load detection sensor generates a load/unload information for each region at which the load detection sensor is installed, sets the load/unload information as a load state with respect to a region at which the load detection sensor is generated, and which sets the load/unload information as an unload state with respect to a region at which the load signal is not generated, wherein the bottom support unit provides a mounting region at which a plurality of containers are mounted, the load detection sensor is installed at each of a plurality of mounting regions, and the control system activates the folding driving unit to a driving possible state if the load signal is not generated at an entirety of the load detection sensors, and deactivates the folding driving unit so it does not drive if at least one among the load identification sensor generates the load signal.

2. The article transfer apparatus of claim 1, wherein the top support unit has an open region, and the folding driving unit is positioned at the open region of the top support unit.

3. The article transfer apparatus of claim 1, wherein the link unit is configured in a plurality and positioned spaced apart from each other, and each of the plurality of link units include:

a first support bar having an end rotatably coupled to the top support unit; and a second support bar having an end coupled to the other end of the first support bar and having the other end rotatably coupled to the bottom support unit.

4. The article transfer apparatus of claim 3, wherein the link unit includes:

a first link unit connected to the top support unit and the bottom support unit;

a second link unit connected to the top support unit and the bottom support unit, positioned spaced apart from the first link unit, and folding in a direction facing the first link unit;

a third link unit connected to the top support unit and the bottom support unit, positioned spaced apart from the first link unit, and folding in a same direction as the first link unit; and a fourth link unit connected to the top support unit and the bottom support unit, positioned facing the third link unit, and folding in a same direction as the second link unit.

5. The article transfer apparatus of claim 4, wherein the link unit includes:

a first link shaft connecting points at which the first link unit and the third link unit pin couple to; and a second link shaft connecting points at which the second link unit and the fourth link unit pin couple to.

6. The article transfer apparatus of claim 5, wherein the link unit includes:

a first folding shaft connected between the first link unit and the third link unit, and which couples to the folding driving unit; and a second folding shaft connected between the second link unit and the fourth link unit, and which couples to the folding driving unit.

7. The article transfer apparatus of claim 6, wherein the folding driving unit includes:

a first rod having an end coupled to a folding shaft of the link unit; and a driving actuator having an end coupled to the other end of the first rod and a body coupled to the top support unit, and when forwardly driven forwardly drives the first rod and when backwardly driven backwardly drives the first rod.

8. The article transfer apparatus of claim 1, further including a fixing member for coupling between the top support unit and the semiconductor fab.

9. The article transfer apparatus of claim 1, further including a buffer identification sensor coupled to the top support unit and which transmits a buffer information to the OHT by communicating with the OHT.

10. The article transfer apparatus of claim 9, wherein the buffer identification sensor is formed as an RFID tag, the RFID tag includes the buffer information, and the OHT reads the buffer information if it adjoins a region at which communication with the RFID tag is possible.

11. The article transfer apparatus of claim 1, further comprising:
a buffer control unit configured to be input with a container information of the container by communicating with the container when the container is mounted on the mounting region, and which transmits the container information which is input to the control system.

12. The article transfer apparatus of claim 11, wherein the buffer control unit includes:
an antenna unit installed at the bottom support unit; and
a buffer communication unit electrically connected to the antenna unit and which communicates with the control system, and transmits the container information to the control system when the container is loaded.

13. The article transfer apparatus of claim 1, further comprising:
a reflective plate which couples with the bottom support unit and which reflects a light; and wherein the OHT determines a mounting region of the container by sensing the reflective plate.

14. The article transfer apparatus of claim 1, wherein the folding driving unit further includes a manual operation unit, and
wherein the manual operation unit couples to a side of the top support unit, connects to a driving shaft of the folding driving unit, and by rotating in a direction the folding driving unit is driven to fold the link unit, and by rotating in another direction the folding driving unit is driven to open the link unit.

15. An article transfer apparatus at which an OHT transfers a container, the article transfer apparatus comprising:
a top support unit fixed to a top space within a semiconductor fab and at which an open region is formed;
a bottom support unit positioned spaced apart below the top support unit and including a plurality of mounting regions on which the container is mounted;
a fixing member coupled between the top support unit and the semiconductor fab;
a link unit coupled between the top support unit and the bottom support unit, which can be folded, and which is configured in a plurality to be spaced apart from each other;
a folding driving unit positioned at the open region, connecting the top support unit and the link unit, configured so when not driven a space that the container can be mounted on is formed by the link unit being spread, and when driven the bottom support unit closely contacts the top support unit by folding the link unit, and the folding driving unit is positioned to not go beyond a top portion of the support unit;
a buffer identification sensor formed as an RFID tag and including a buffer information, coupled to the top support unit, and which transmits the buffer information to the OHT by communicating with the OHT;
a load detection sensor installed at each mounting region of the bottom support unit, and which generates a load signal when mounted on the container;
a control system which controls the OHT to transfer the OHT positioned in a loaded state according to a transfer scheduling of the container, or to load the container to a region which is not loaded, and the control system is input with the load signal in communication with the load identification sensor, the load identification sensor generates a load/unload information for each region at which the load identification sensor is installed, sets the load/unload information as a load state with respect to a region at which the load sensor is generated, and which sets the load/unload information as an unload state with respect to a region at which the load signal is not generated, and activates the folding driving unit to a drivable state if the loading signal does not occur at an entirety of the load detection sensors, and deactivates the folding driving unit so it cannot drive if at least one load signal occurs among the load detection sensors;
a buffer control unit including an antenna unit installed at the bottom support unit and a buffer communication unit electrically connected to the antenna unit and which communicates with the control system, and transmits the container information to the control system when the container is loaded, and which is configured to be input with a container information of the container by communicating with the container when the container is mounted on the mounting region, and which transmits the container information which is input to the control system; and
a reflective plate which couples with the bottom support unit and which reflects a light, and
wherein the link unit includes:
a first link unit connected to the top support unit and the bottom support unit;
a second link unit connected to the top support unit and the bottom support unit, positioned spaced apart from the first link unit, and folding in a direction facing the first link unit;
a third link unit connected to the top support unit and the bottom support unit, positioned spaced apart from the first link unit, and folding in a same direction as the first link unit; and
a fourth link unit connected to the top support unit and the bottom support unit, positioned facing the third link unit, and folding in a same direction as the second link unit;
a first link shaft connecting points at which the first link unit and the third link unit pin couple to;
a second link shaft connecting points at which the second link unit and the fourth link unit pin couple to;
a first folding shaft connected between the first link unit and the third link unit, and which couples to the folding driving unit;
a second folding shaft connected between the second link unit and the fourth link unit, and which couples to the folding driving unit, and
wherein each of the plurality of link units include:
a first support bar having an end rotatably coupled to the top support unit; and
a second support bar having an end coupled to the other end of the first support bar and having the other end rotatably coupled to the bottom support unit, and
wherein the folding driving unit includes:
a first rod having an end coupled to a folding shaft of the link unit;
a driving actuator having an end coupled to the other end of the first rod and a body coupled to the top support unit, and when forwardly driven forwardly drives the first rod and when backwardly driven backwardly drives the first rod; and
a manual operation unit which couples to a side of the top support unit, connects to a driving shaft of the folding driving unit, and by rotating in a direction the folding driving unit is driven to fold the link unit, and by rotating in another direction the folding driving unit is driven to open the link unit.

* * * * *